United States Patent
Son et al.

(10) Patent No.: US 7,439,826 B2
(45) Date of Patent: Oct. 21, 2008

(54) PROGRAMMABLE SURFACE ACOUSTIC WAVE FILTER

(75) Inventors: Mi-hyun Son, Seoul (KR); Takahiro Sato, Yokohama (JP); Kwy-ro Lee, Daejeon (KR); Seong-soo Lee, Suwon-si (KR); Shinichi Haruyama, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 314 days.

(21) Appl. No.: 11/347,323

(22) Filed: Feb. 6, 2006

(65) Prior Publication Data
US 2006/0194563 A1 Aug. 31, 2006

(30) Foreign Application Priority Data
Feb. 4, 2005 (KR) ............... 10-2005-0010673

(51) Int. Cl.
*H03H 9/64* (2006.01)
(52) U.S. Cl. ................ 333/193; 333/17.1
(58) Field of Classification Search ........... 333/193, 333/152, 154, 17.1, 18; 310/313 B
See application file for complete search history.

(56) References Cited

U.S. PATENT DOCUMENTS

| | | | | |
|---|---|---|---|---|
| 3,479,572 | A | * | 11/1969 | Pokorny ............... 257/254 |
| 4,024,480 | A | * | 5/1977 | Reeder et al. ............. 333/166 |
| 4,382,232 | A | * | 5/1983 | Laurent ............... 329/303 |
| 5,144,262 | A | | 9/1992 | Hunsinger |
| 5,194,837 | A | * | 3/1993 | Smythe et al. ............. 333/166 |
| 5,387,887 | A | | 2/1995 | Zimmerman et al. |
| 6,291,924 | B1 | * | 9/2001 | Lau et al. ............... 310/313 R |
| 6,459,345 | B1 | * | 10/2002 | Kosinski et al. ............. 333/166 |
| 6,541,893 | B2 | * | 4/2003 | Zhu et al. ............... 310/313 B |

FOREIGN PATENT DOCUMENTS

| | | | |
|---|---|---|---|
| JP | 55-039454 | * | 3/1980 |
| JP | 2004-072549 | * | 3/2004 |

OTHER PUBLICATIONS

Machine translation of Isobe JP 2004-072549, Mar. 4, 2004.*

* cited by examiner

*Primary Examiner*—Barbara Summons
(74) *Attorney, Agent, or Firm*—Sughrue Mion, PLLC

(57) ABSTRACT

A programmable surface acoustic wave filter and methods thereof including a piezoelectric substrate, a ground electrode formed in a comb structure on the piezoelectric substrate, a plurality of output electrodes formed in comb structures on the piezoelectric substrate and alternately disposed together with the ground electrode, and a switching unit performing a switching operation so as to selectively transmit output signals output from the plurality of output electrodes to an output node. As a result, a filtering characteristic of the programmable surface acoustic wave filter can be programmed in a desired format.

12 Claims, 3 Drawing Sheets

PROGRAMMABLE SURFACE ACOUSTIC WAVE FILTER

CROSS-REFERENCE TO RELATED APPLICATIONS

This application claims priority from Korean Patent Application No. 2005-10673 filed on Feb. 4, 2005 in the Korean Intellectual Property Office, the disclosure of which is incorporated herein by reference.

BACKGROUND OF THE INVENTION

1. Field of the Invention

Apparatuses and methods consistent with the present invention relate to Surface Acoustic Wave (SAW) filters, and more particularly, to programmable SAW filters in which a filtering characteristic can be programmed in a desired format.

2. Description of the Related Art

SAW filters extract desired signals from input signals and output the desired signals using an SAW principle. Such SAW filters when configured as passive filters do not consume power during their operations. Thus, SAW filters are used, for example, in portable terminals in which power consumption must be reduced.

Such an SAW filter is realized by alternately forming output and ground electrodes having comb structures on a piezoelectric substrate. A filtering characteristic of the SAW filter is determined based on distances and overlapped degrees between the output and ground electrodes. Positions and structures of the output and ground electrodes formed on the piezoelectric substrate may not be adjusted. Thus, the filtering characteristic of the SAW filter is determined in advance during manufacturing of the SAW filter, and the determined filtering characteristic cannot be changed.

However, the filtering characteristic of the SAW filter may be required to be changed during the use of the SAW filter. Thus, an SAW filter whose filtering characteristic can be changed when necessary must be realized.

SUMMARY OF THE INVENTION

Accordingly, is the present invention provides an SAW filter capable of programming a filtering characteristic in a desired format, as necessary.

An SAW filter may include: a piezoelectric substrate; a ground electrode formed in a comb structure on the piezoelectric substrate; a plurality of output electrodes formed in comb structures on the piezoelectric substrate and alternately disposed together with the ground electrode; and a switching unit performing a switching operation so as to selectively transmit output signals output from the plurality of output electrodes to an output node.

The switching unit may include: a plurality of switches equal to the plurality of output electrodes in number and performing switching operations so as to transmit the output signals output from the plurality of output electrodes respectively corresponding to the plurality of switches to the output node.

The plurality of switches may perform the switching operations according to switching control signals so as to transmit the output signals output from the plurality of output electrodes respectively corresponding to the plurality of switches to the output node or a ground node.

Further, the plurality of switches may be formed on the piezoelectric substrate.

Each of the plurality of switches may be realized using at least one transistor.

The plurality of switches may include: if signals on a logic level "high" are input as the switching control signals, output node switching transistors providing paths through which the output signals output from the output electrodes are transmitted to the output node; and if signals on a logic level "low" are input as the switching control signals, ground node switching transistors providing paths through which the output signals output from the output electrodes are transmitted to the ground node.

BRIEF DESCRIPTION OF THE DRAWINGS

The above and other aspects of the present invention will be more apparent by describing in detail exemplary embodiments of the present invention with reference to the accompanying drawings, in which.

DETAILED DESCRIPTION OF THE EXEMPLARY EMBODIMENTS OF THE INVENTION

Figure 1:
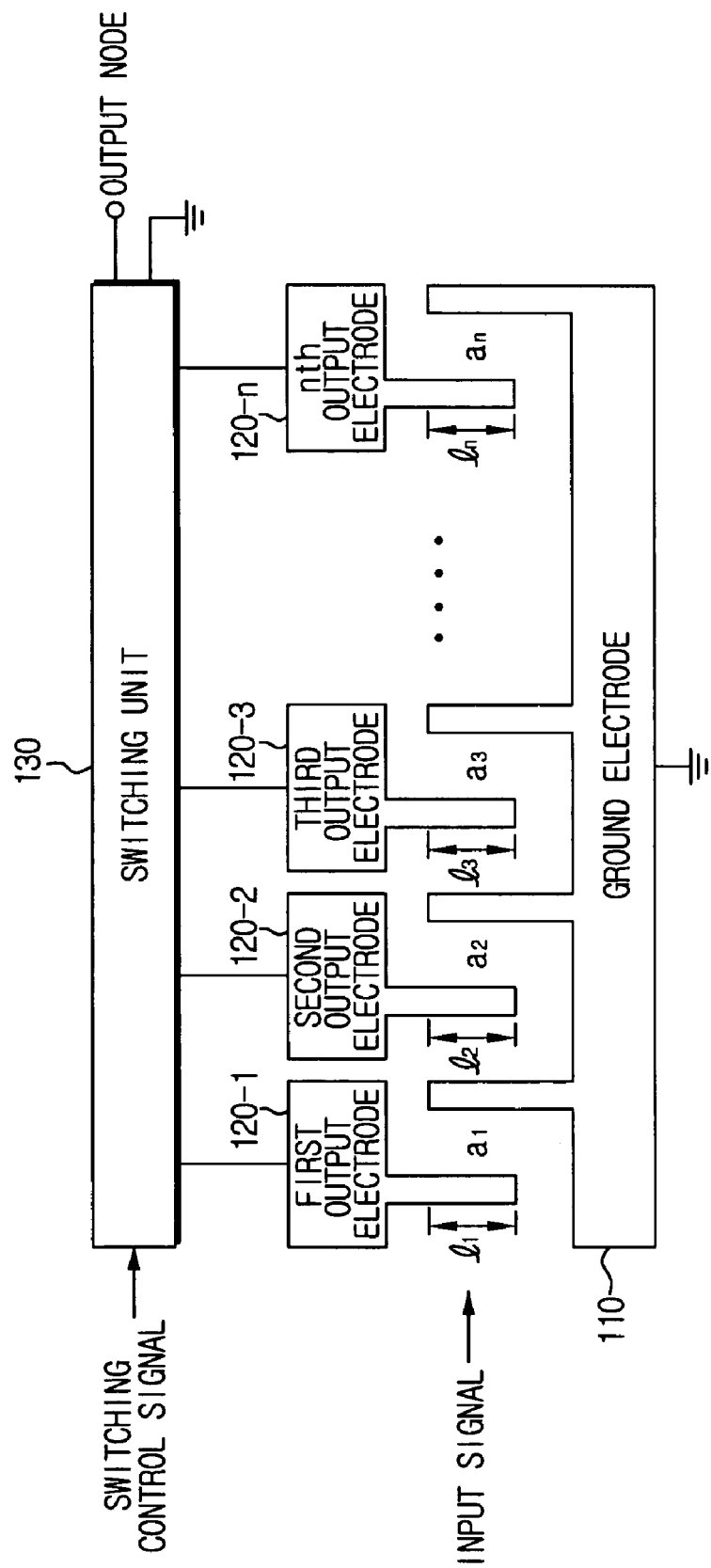
FIG. 1 is a view illustrating a programmable SAW filter according to an exemplary embodiment of the present invention.

Exemplary embodiments of the present invention will be described in greater detail with reference to the accompanying drawings.

In the following description, same drawing reference numerals are used for the same elements, even in different drawings. The matters defined in the description such as detailed construction and elements are nothing but the ones provided to assist in a comprehensive understanding of the invention. Thus, it is apparent that the present invention can be carried out without many of those defined matters. Also, well-known functions or constructions are not described in detail since they would obscure the invention in unnecessary detail.

FIG. 1 is a view illustrating a programmable SAW filter according to an exemplary embodiment of the present invention. The programmable SAW filter can program a filtering characteristic in a desired format. The filtering characteristic may be programmed whenever necessary and also several times. In other words, a possible number of times the filtering characteristic is programmed is not limited.

Referring to FIG. 1, the programmable SAW filter includes a ground electrode 110, a plurality of output electrodes 120-1 through 120-n, and a switching unit 130.

The ground electrode 110 and the plurality of output electrodes 120-1 through 120-n are formed in comb structures on a piezoelectric substrate (not shown). The ground electrode 110 and the plurality of output electrodes 120-1 through 120-n are alternately disposed as shown in FIG. 1.

If input signals are input between the plurality of output electrodes 120-1 through 120-n and the ground electrode 110, the plurality of output electrodes 120-1 through 120-n respectively generate output signals and output these signals to the switching unit 130. In other words, a first output signal is output from the first output electrode 120-1, a second output signal is output from the second output electrode 120-2, a third output signal is output from the third output electrode 120-3, ..., and an $n^{th}$ output signal is output from the $n^{th}$ output electrode 120-n.

The output signals are generated by multiplying input signals existing between the plurality of output electrodes 120-1 through 120-n and the ground electrode 110 by filtering coefficients $a_1, a_2, a_3, \ldots,$ and $a_n$. In the exemplary embodiment, the first output signal is generated by multiplying an input signal existing between the first electrode 120-1 and the ground electrode 110 by the filtering coefficient $a_1$, the second output signal is generated by multiplying an input signal existing between the second output electrode 120-2 and the ground electrode 110 by the filtering coefficient $a_2$, the third output signal is generated by multiplying an input signal existing between the third output electrode 120-3 and the ground electrode 110 by the filtering coefficient $a_3$, ..., and the $n^{th}$ output signal is generated by multiplying an input signal existing between the $n^{th}$ output electrode 120-n and the ground electrode 110 by the filtering coefficient $a_n$.

The filtering coefficients $a_1, a_2, a_3, \ldots,$ and $a_n$ are respectively proportional to overlapped lengths $1_1, 1_2, 1_3, \ldots,$ and $1_n$ between the plurality of output electrodes 120-1 through 120-n and the ground electrode 110. That is, the filtering coefficient $a_1$ is proportional to the overlapped length $1_1$ between the first output electrode 120-1 and the ground electrode 110, the filtering coefficient $a_2$ is proportional to the overlapped length $1_2$ between the second output electrode 120-2 and the ground electrode 110, the filtering coefficient $a_3$ is proportional to the overlapped length $1_3$ between the third output electrode 120-3 and the ground electrode 110, ..., and the filtering coefficient $a_n$ is proportional to the overlapped length $1_n$ between the $n^{th}$ output electrode 120-n and the ground electrode 110.

The switching unit 130 performs a switching operation so as to selectively transmit the output signals (first through $n^{th}$ output signals) output from the plurality of output electrodes 120-1 through 120-n to an output node. In detail, the switching unit 130 may perform the switching operation so as to output at least one of the output signals to the output node or may perform the switching operation so as not to output any one of the output signals or a plurality of the output signals to the output node.

Thus, sum signals of the output signals selectively transmitted by the switching unit 130 are output to the output node. For example, if the switching unit 130 performs the switching operation so as to transmit the first and third output signals to the output node, a sum signal of the first and third output signals is output to the output node.

The switching operation of the switching unit 130 is performed according to a switching control signal applied from an external source.

The switching unit 130 according to an exemplary embodiment will now be described in more detail with reference to FIG. 2. For understanding, besides the switching unit 130, the ground electrode 110, and the plurality of output electrodes 120-1 and 120-n are also shown in FIG. 2.

Figure 2:
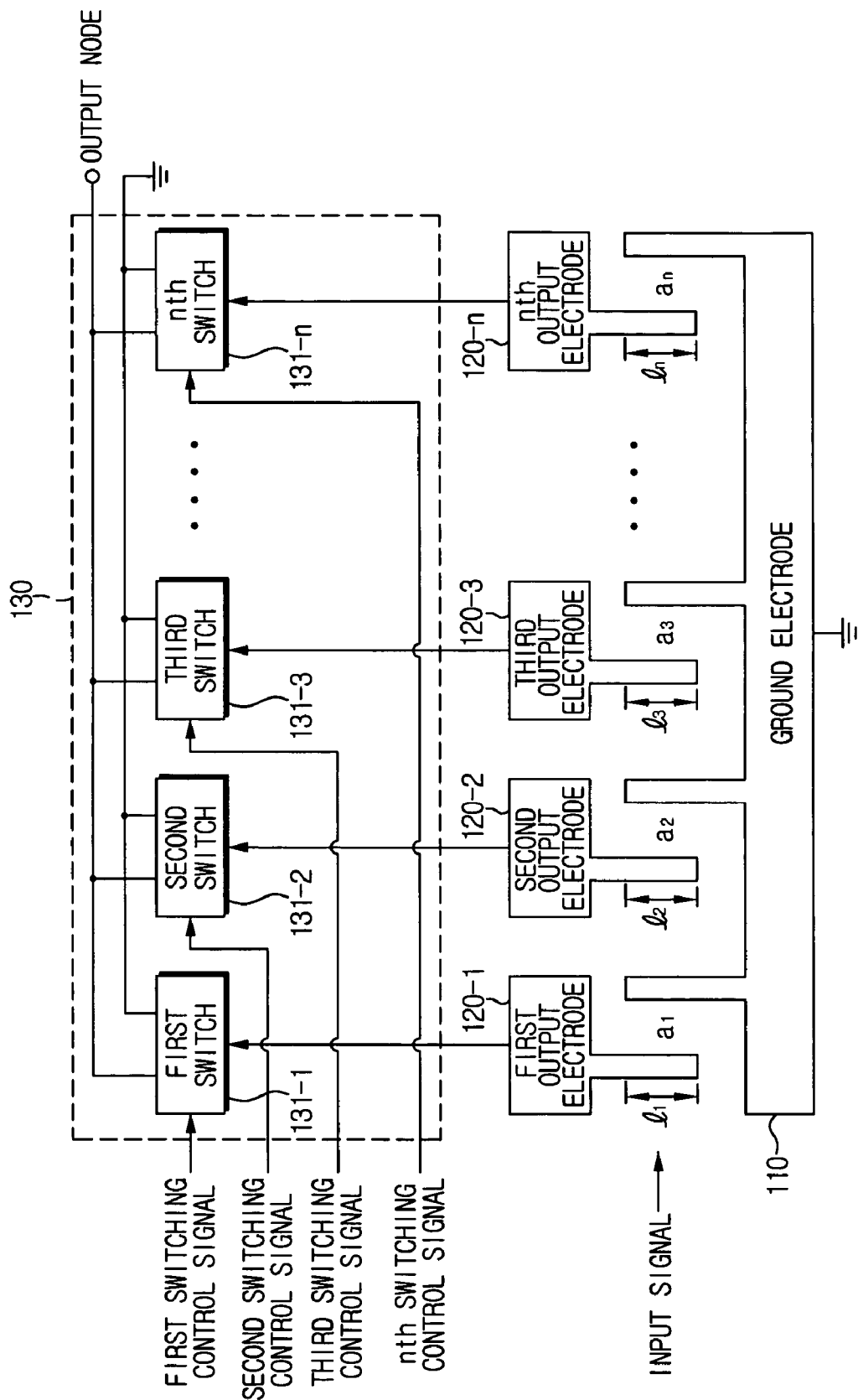
FIG. 2 is a view illustrating a switching unit shown in FIG. 1 according to an exemplary embodiment of the invention.

Referring to FIG. 2, the switching unit 130 includes a plurality of switches 131-1 through 131-n. A number, n, of the plurality of switches is equal to a number, n, of the output electrodes, and the plurality of switches are respectively connected to the output electrodes.

The plurality of switches 131-1 through 131-n perform switching operations so as to transmit the output signals output from the output electrodes respectively corresponding to the plurality of switches 131-1 through 131-n to the output node or a ground node. The plurality of switches 131-1 through 131-n perform the switching operations according to switching control signals input from external sources.

For example, the first switch 131-1 performs the switching operation according to a first switching control signal so as to output the first output signal to the output node or the ground node, the second switch 131-2 performs the switching operation according to a second switching control signal so as to output the second output signal to the output node or the ground node, the third switch 131-3 performs the switching operation according to a third switching control signal so as to output the third output signal to the output node or the ground node, ..., and the $n^{th}$ switch 131-n performs the switching operation according to a $n^{th}$ switching control signal so as to output the $n^{th}$ output signal to the output node or the ground node.

The switching unit 130 including the plurality of switches 131-1 through 131-n, may be formed on a piezoelectric substrate (not shown). Also, each of the plurality of switches 131-1 through 131-n constituting the switching unit 130 may be realized using at least one transistor.

Figure 3:
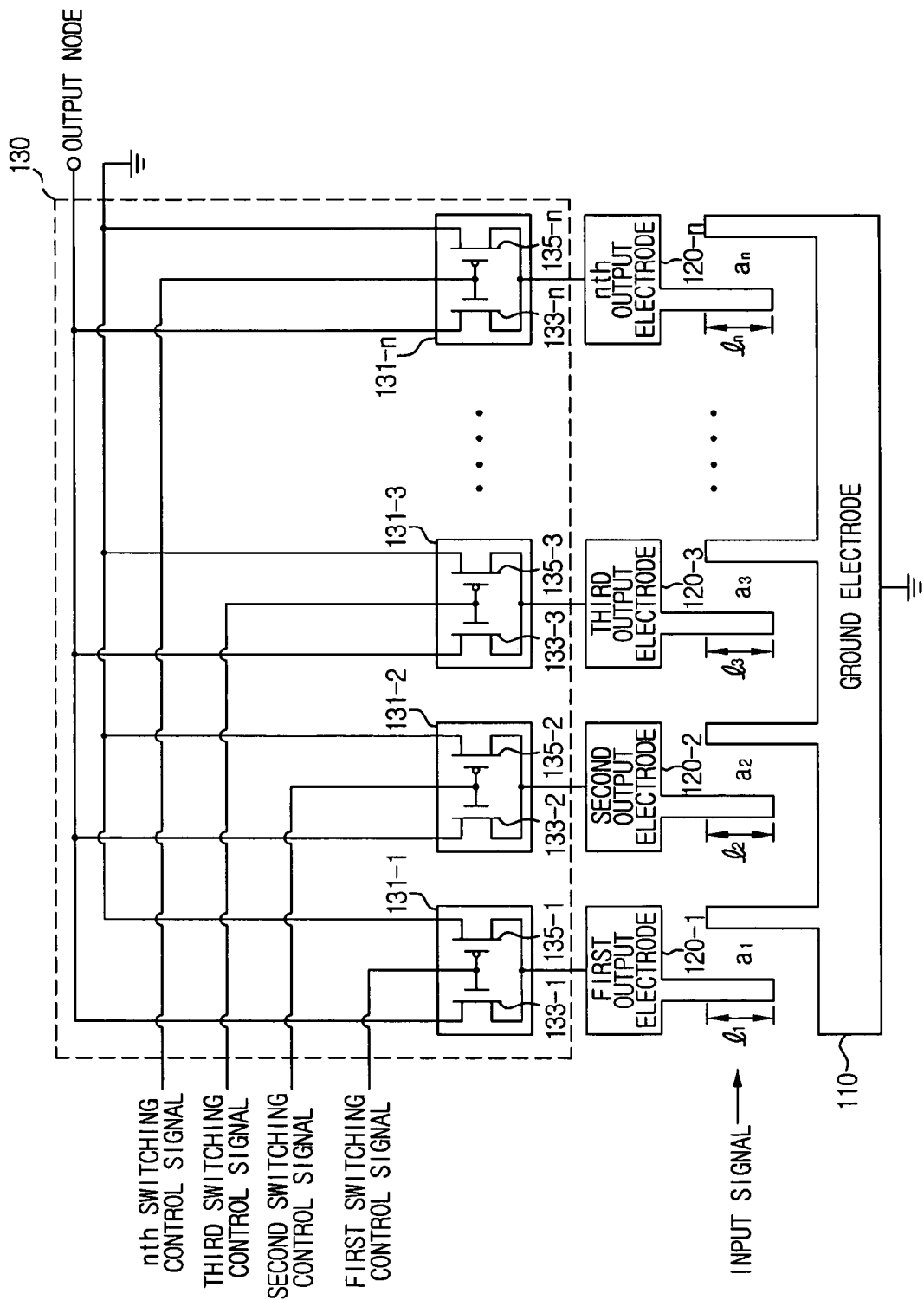
FIG. 3 is a view illustrating a plurality of switches shown in FIG. 2 according to an exemplary embodiment of the invention.

A plurality of switches 131-1 through 131-n realized using transistors (TRs) according to an exemplary embodiment of the invention are shown in FIG. 3. For understanding, besides the switching unit 130 including the plurality of switches 131-1 through 131-n, the ground electrode 110 and the plurality of output electrodes 120-1 through 120-n are also shown in FIG. 3.

As shown in FIG. 3, the plurality of switches 131-1 through 131-n are respectively realized using TRs 133-1 through 133-n for switching the output node and TRs 135-1 through 135-n for switching the ground node.

If switching control signals are on a logic level "high," the TRs 133-1 through 133-n are turned on. If the switching control signals are on a logic level "low," the TRs 133-1 through 133-n are turned off.

If the switching control signals are on the logic level "high," the TRs 135-1 through 135-n are turned off. If the switching control signals are on the logic level "low," the TRs 135-1 through 135-n are turned on. Since the switching control signals are reversed and then input, the TRs 135-1 through 135-n are turned off when the switching control signals are on the logic level "high" while being turned on when the switching control signals are on the logic level "low."

Thus, if the switching control signals are on the logic level "high," the TRs 133-1 through 133-n are turned on while the TRs 135-1 through 135-n are turned off. As a result, the output signals output from the output electrodes are transmitted through the TRs 133-1 through 133-n to the output node.

If the switching control signals are on the logic level "low," the TRs 133-1 through 133-n are turned off while the TRs 135-1 through 135-n are turned on. As a result, the output signals output from the output electrodes are transmitted through the TRs 135-1 through 135-n to the ground node.

For example, if a second switching control signal is on a logic level "high," the TR 133-2 provided in the second switch 131-2 is turned on while the TR 135-2 is turned off. As a result, the second output signal output from the second output electrode 120-2 is transmitted through the TR 133-2 to the output node.

If the second switching control signal is on a logic level "low," the TR 133-2 of the second switch 131-2 is turned off while the TR 135-2 is turned on. As a result, the second output signal output from the second output electrode 120-2 is transmitted through the TR 135-2 to the ground node.

If the second output signal is transmitted to the output node, the filtering coefficient (hereinafter referred to in this embodiment as a second filtering coefficient) proportional to the overlapped length $l_2$ between the second output electrode 120-2 and the ground electrode 110 is $a_2$. However, if the second output signal is transmitted to the ground node, the second filtering coefficient may be assumed as "0."

This means that a logic level of a corresponding switching control signal can be adjusted to adjust a corresponding filtering coefficient.

For example, if signals on a logic level "low" are applied as the second and third switching control signals, the second and third filtering coefficients are each "0." This indicates that the second and third output signals are not transmitted to the output node.

In terms of the output node, this produces the same result as the present programmable SAW filter not including the second and third output electrodes 120-2 and 120-3.

Thus, logic levels of the switching control signals respectively applied to the plurality of switches 131-1 through 131-n can be adjusted to adjust the filtering coefficients. In other words, the present programmable SAW filter can program a filtering characteristic in a desired format.

The logic levels of the switching control signals can be changed at any time, and thus, the filtering characteristic can be programmed anytime and also several times.

The present programmable SAW filter may be provided in a terminal to be used for communications. For example, the present programmable SAW filter may be used to allocate an identification (ID) to a terminal and to spread a transmitted signal and despread a received signal using the ID.

As described above, according to the present invention, a filtering characteristic of a programmable SAW filter according to exemplary embodiments of the invention can be programmed in a desired format. Thus, if the programmable SAW filter is provided in a terminal to be used for communications, the programmable SAW filter can allocate an ID to a terminal further effectively spread a transmitted signal and despread a received signal using the ID.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A surface acoustic wave filter comprising:
a piezoelectric substrate;
a ground electrode which is disposed on the piezoelectric substrate;
a plurality of output electrodes which are alternately disposed together with the ground electrode on the piezoelectric substrate; and
a switching unit which performs a switching operation that selectively transmits output signals output from the plurality of output electrodes to one of an output node and a ground, each output signal being generated by multiplying a corresponding input signal between the output signal and the ground electrode by a corresponding filtering coefficient.

2. The surface acoustic wave filter of claim 1, wherein the switching unit comprises a plurality of switches which is equal in number to the plurality of output electrodes, and performs switching operations so as to transmit the output signals output from the plurality of output electrodes respectively corresponding to the plurality of switches, to the output node.

3. The surface acoustic wave filter of claim 1, wherein the ground electrode has a comb structure.

4. The surface acoustic wave filter of claim 1, wherein each of the plurality of output electrodes has a comb structure.

5. The surface acoustic wave filter according to claim 1, wherein the filtering coefficients are proportional to overlapped lengths between corresponding output electrodes and the ground electrode.

6. The surface acoustic wave filter according to claim 1, wherein the switching unit performs the switching operation that selectively transmits at least one of:
the output signal from one of the plurality of output electrodes;
the output signals from all of the plurality of output electrodes; or
the output signals from a pre selected number of the output electrodes, the number being from 0 to n.

7. A surface acoustic wave filter comprising:
a piezoelectric substrate;
a ground electrode which is disposed on the piezoelectric substrate;
a plurality of output electrodes which electrodes are alternately disposed with the ground electrode on the piezoelectric substrate; and
a switching unit, comprising a plurality of switches, which switching unit performs a switching operation that selectively transmits output signals output from the plurality of output electrodes to an output node, wherein the switches perform the switching operations according to switching control signals to transmit the output signals output from the plurality of output electrodes respectively corresponding to the plurality of switches, to one of the output node and a ground node.

8. The surface acoustic wave filter of claim 7, wherein the plurality of switches is disposed on the piezoelectric substrate.

9. The surface acoustic wave filter of claim 8, wherein each of the plurality of switches includes at least one transistor.

10. The surface acoustic wave filter of claim 9, wherein the plurality of switches comprises at least one of output node switching transistors and ground node switching transistors, the
output node switching transistors providing paths through which the output signals output from the output electrodes are transmitted to the output node if signals at a logic level "high" are input as the switching control signals; and
the ground node switching transistors providing paths through which the output signals output from the output electrodes are transmitted to the ground node if signals at a logic level "low" are input as the switching control signals.

11. A method of filtering surface acoustic waves, the method comprising:
generating output signals by multiplying input signals existing between output electrodes and a ground electrode by filtering coefficients; and
selectively transmitting the generated output signals to one of an output node and a ground node.

12. The method of filtering surface acoustic waves according to claim 11, wherein sum signals of the output signals are provided to the output node.

* * * * *